(12) United States Patent
Youn et al.

(10) Patent No.: US 10,957,757 B2
(45) Date of Patent: Mar. 23, 2021

(54) DISPLAY DEVICE

(71) Applicant: Samsung Display Co., Ltd., Yongin-Si (KR)

(72) Inventors: Ilgoo Youn, Yongin-si (KR); Jaewon Kim, Yongin-si (KR); Hyunae Park, Yongin-si (KR); Hyungjun Park, Yongin-si (KR); Seungwoo Sung, Yongin-si (KR); Junyong An, Yongin-si (KR); Nuree Um, Yongin-si (KR); Youngsoo Yoon, Yongin-si (KR); Jieun Lee, Yongin-si (KR); Seunghan Jo, Yongin-si (KR)

(73) Assignee: Samsung Display Co., Ltd. (KR)

( * ) Notice: Subject to any disclaimer, the term of this patent is extended or adjusted under 35 U.S.C. 154(b) by 30 days.

(21) Appl. No.: 16/524,177

(22) Filed: Jul. 29, 2019

(65) Prior Publication Data

US 2020/0176550 A1    Jun. 4, 2020

(30) Foreign Application Priority Data

Nov. 30, 2018  (KR) .................. 10-2018-0153019

(51) Int. Cl.
*H01L 27/32* (2006.01)

(52) U.S. Cl.
CPC ...... *H01L 27/3279* (2013.01); *H01L 27/3258* (2013.01); *H01L 27/3276* (2013.01); *H01L 2227/32* (2013.01)

(58) Field of Classification Search
CPC ............ H01L 27/3279; H01L 27/3258; H01L 27/3276; H01L 2227/32
See application file for complete search history.

(56) References Cited

U.S. PATENT DOCUMENTS

| 7,227,312 | B2 | 6/2007 | Kwak et al. |
| 9,972,693 | B2 | 5/2018 | Kim et al. |
| 10,134,829 | B2 | 11/2018 | Shin et al. |
| 10,135,020 | B1 | 11/2018 | Zhang et al. |
| 2016/0233248 | A1* | 8/2016 | Kwak ............. H01L 27/1266 |
| 2017/0287995 | A1 | 10/2017 | Kim et al. |

(Continued)

FOREIGN PATENT DOCUMENTS

| CN | 107403825 A | 11/2017 |
| EP | 3229287 A1 | 10/2017 |

(Continued)

*Primary Examiner* — Phat X Cao
(74) *Attorney, Agent, or Firm* — Innovation Counsel LLP

(57) ABSTRACT

A display device including: a substrate including a display area, a peripheral area, and a pad area; a first main voltage line in the peripheral area, and a first connector extending from the first main voltage line to the pad area; and a second main voltage line in the peripheral area, and a second connector extending from the second main voltage line to the pad area, wherein each of the first connector and the second connector includes a first and second layer overlapping each other with a first insulating layer therebetween, the first insulating layer is in the display area and the peripheral area, the peripheral area includes an open area exposing the first and second connector and surrounding the display area, and the first insulating layer includes slits between the first and second connector and extending from an end of the first insulating layer toward the display area.

20 Claims, 7 Drawing Sheets

(56) References Cited

U.S. PATENT DOCUMENTS

| | | | |
|---|---|---|---|
| 2017/0337873 | A1 | 11/2017 | Kim et al. |
| 2017/0358641 | A1 | 12/2017 | Park et al. |
| 2018/0090518 | A1 | 3/2018 | Kim et al. |
| 2018/0138431 | A1 | 5/2018 | Nishimura |
| 2018/0145127 | A1* | 5/2018 | Shin .................... H01L 51/5253 |
| 2019/0164995 | A1* | 5/2019 | Lee .................... H01L 27/1218 |

FOREIGN PATENT DOCUMENTS

| | | |
|---|---|---|
| KR | 10-0579195 B1 | 5/2006 |
| KR | 10-2014-0028604 A | 3/2014 |
| KR | 10-2016-0147195 A | 12/2016 |
| KR | 10-2017-0115149 A | 10/2017 |
| KR | 10-2018-0058265 A | 6/2018 |

* cited by examiner

DISPLAY DEVICE

CROSS-REFERENCE TO RELATED APPLICATION

This application claims the benefit of Korean Patent Application No. 10-2018-0153019, filed on Nov. 30, 2018, in the Korean Intellectual Property Office, the disclosure of which is incorporated herein in its entirety by reference.

BACKGROUND

1. Field

The present disclosure herein relates to a display device.

2. Description of the Related Art

In accordance with rapid advancements in the field of displays allowing the visual display of a variety of electrical signal information, various display devices having improved characteristics, such as a slim profile, a light weight, and low power consumption, are being researched and developed. One type of these displays is an organic light-emitting display device, which is a self-emissive display device that does not need an additional power source, so that it may be driven with a low voltage and formed of a light film. Additionally, the organic light-emitting display device provides high-quality characteristics such as a wide viewing angle, high contrast, and a rapid response. Thus, it has gained a lot of attention as a next-generation display device.

The organic light-emitting display device includes a plurality of pixels. When the organic light-emitting display device operates by an analog driving method, pixels of the organic light-emitting display device render a grayscale image by adjusting brightness according to a magnitude of input voltage or current data. When the organic light-emitting display device operates by a digital driving method, even when pixels of the organic light-emitting device emit light with a same brightness, they render a grayscale image according to different light-emission time periods. In a power line supplying power to the pixels, a voltage drop (or a current-resistance (IR) drop) may occur due to resistance components. This may deteriorate image quality of the organic light-emitting display device.

SUMMARY

One or more embodiments include a display device configured to display a high-quality image and prevent a short circuit between wires.

Additional aspects will be set forth in part in the description which follows and, in part, will be apparent from the description, or may be learned by practice of the presented embodiments.

According to one or more embodiments, a display device includes a substrate including a display area, a peripheral area outside the display area, and a pad area in the peripheral area; a first main voltage line arranged in the peripheral area of the substrate and between an edge of the display area and the pad area, and a first connector extending from the first main voltage line to the pad area; and a second main voltage line arranged in the peripheral area of the substrate and corresponding to another edge of the display area, and a second connector extending from the second main voltage line to the pad area, wherein each of the first connector and the second connector includes a first layer and a second layer overlapping each other with a first insulating layer therebetween, wherein the first insulating layer is arranged in the display area and the peripheral area of the substrate, the peripheral area includes an open area exposing the first connector and the second connector and surrounding the display area, and the first insulating layer includes a plurality of slits arranged between the first connector and the second connector and extending from an end of the first insulating layer toward the display area.

The display device may further include a second insulating layer on the second layer within the open area.

The second insulating layer may further include a height difference reducer at a boundary with the open area between the first connector and the second connector, and a thickness of the height difference reducer may be less than a thickness of the second insulating layer.

Two opposite distal ends of the height difference reducer may overlap the first connector and the second connector, respectively.

The second insulating layer may include a plurality of concave portions in positions respectively overlapping with the plurality of slits.

In the open area, the first connector and the second connector each may include the second layer and may not include the first layer.

In the open area, a side of the first connector and a side of the second connector may include an embossed structure.

In an area in which the second layer overlaps the first layer, the second layer may include a plurality of holes exposing the first insulating layer.

The plurality of holes may constitute a plurality of rows and holes in two rows adjacent to each other, among the plurality of rows, may be arranged to cross each other in a longitudinal direction.

The first insulating layer may include a plurality of contact holes via which the first layer is connected to the second layer and the plurality of contact holes may be arranged between the plurality of holes, respectively.

According to one or more embodiments, a display device includes a substrate including a display area, a peripheral area outside the display area, and a pad area in the peripheral area; a first main voltage line arranged in the peripheral area of the substrate and between an edge of the display area and the pad area, and a first connector extending from the first main voltage line to the pad area; and a second main voltage line arranged in the peripheral area of the substrate and corresponding to another edge of the display area, and a second connector extending from the second main voltage line to the pad area, wherein each of the first connector and the second connector includes a structure in which a first layer and a second layer are stacked, a first insulating layer is arranged between the first layer and the second layer, and a second insulating layer is arranged on the second layer, the peripheral area includes an open area exposing parts of the first connector and the second connector and surrounding the display area, and the second insulating layer includes a height difference reducer at a boundary of the open area between the first connector and the second connector, wherein the height difference reducer has a thickness less than a thickness of the second insulating layer.

Two opposite distal ends of the height difference reducer may overlap the first connector and the second connector, respectively.

In the open area, the first connector and the second connector may each include the second layer and may not include the first layer.

In the open area, a side of the first connector and a side of the second connector may include an embossed structure.

In an area in which the second layer overlaps the first layer, the second layer may include a plurality of holes exposing the first insulating layer.

The plurality of holes may constitute a plurality of rows and holes in two rows adjacent to each other, among the plurality of rows, may be arranged to cross each other in a longitudinal direction.

The first insulating layer may include a plurality of contact holes via which the first layer is connected to the second layer and the plurality of contact holes may be arranged between the plurality of holes, respectively.

The first insulating layer may include a plurality of slits arranged between the first connector and the second connector and extending from an end of the first insulating layer toward the display area.

The second insulating layer may include a plurality of concave portions in positions respectively overlapping with the plurality of slits.

In the open area, at least one dam may be arranged and surround the display area.

In addition to those described above, other aspects, features and effects will become apparent from the following drawings, claims, and detailed descriptions of the present disclosure.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
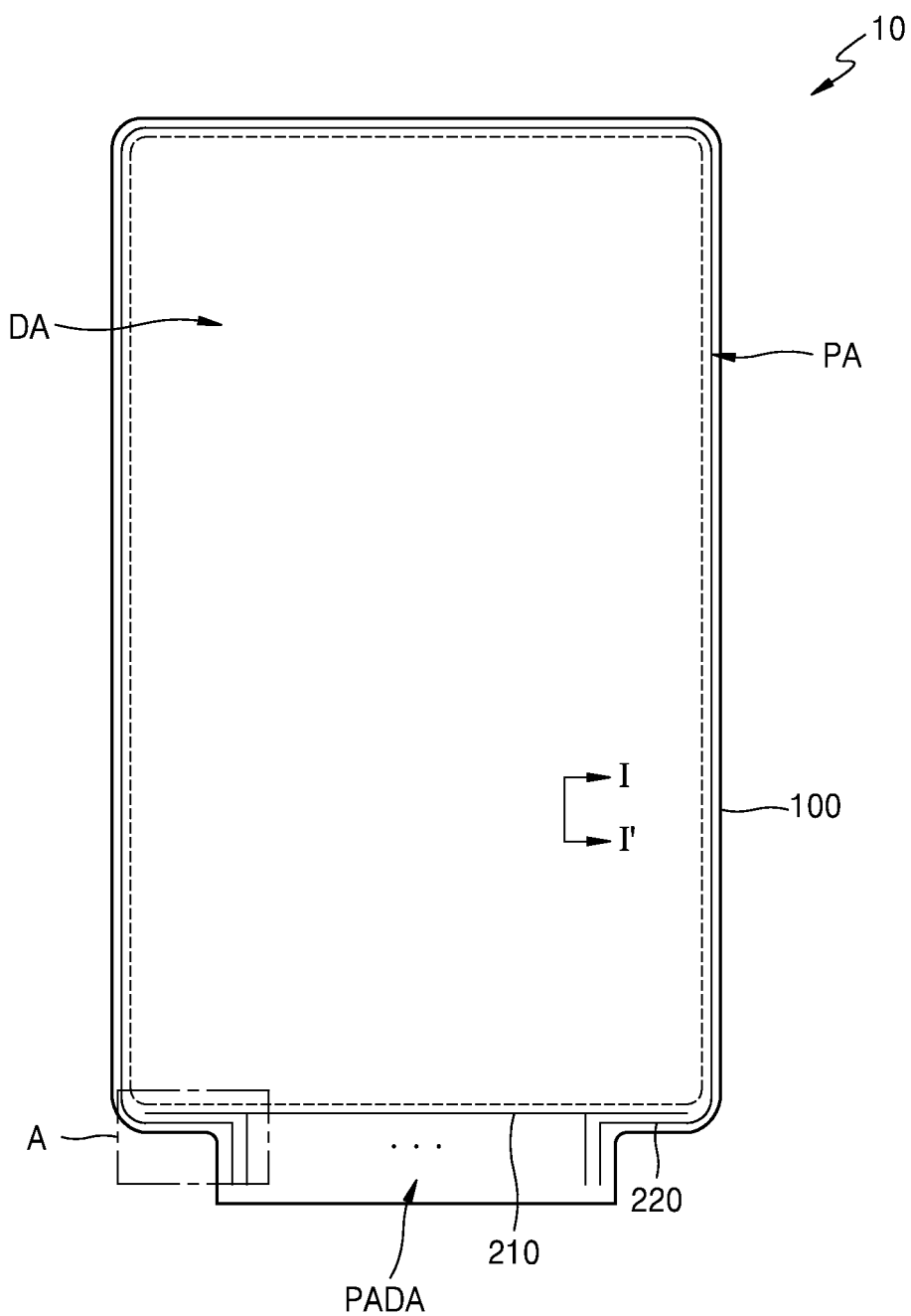
FIG. 1 is a schematic plan view illustrating an example of a display device according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

As the present disclosure allows for various changes and numerous embodiments, particular embodiments will be illustrated in the drawings and described in detail in the written description. Effects and features of the present disclosure and a method of achieving the same will become apparent to those skilled in the art from the following detailed description which discloses various embodiments in conjunction with the annexed drawings. The present disclosure may, however, be embodied in many different forms and should not be construed as being limited to the embodiments set forth herein.

It will be understood that although the terms "first", "second", etc. may be used herein to describe various components, these components should not be limited by these terms. These components are only used to distinguish one component from another.

As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on," another layer, region, or component, it can be directly or indirectly formed on the other layer, region, or component. That is, for example, intervening layers, regions, or components may be present.

Sizes of elements in the drawings may be exaggerated for convenience of explanation. In other words, since sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

Hereinafter, embodiments will be described in detail with reference to the attached drawings. Like reference numerals in the drawings denote like elements, and thus their descriptions will not be repeated.

Figure 2:
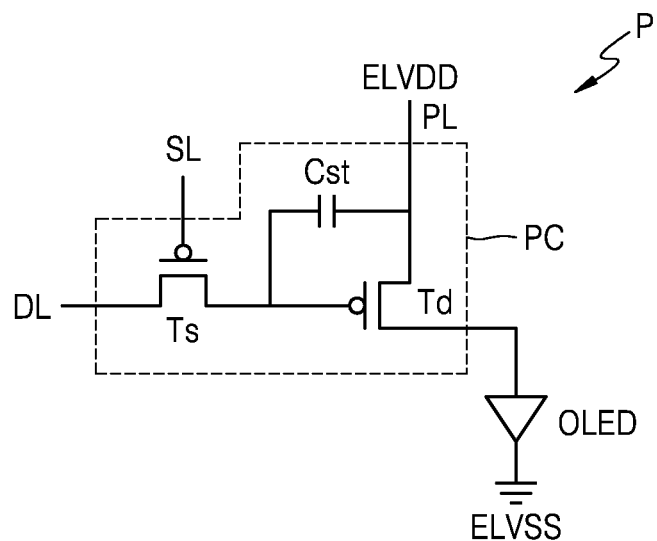
FIG. 2 is an equivalent circuit diagram of a pixel of the display device of FIG. 1.

FIG. 1 is a schematic plan view illustrating an example of a display device 10 according to an embodiment. FIG. 2 is an equivalent circuit diagram of a pixel of the display device 10 of FIG. 1

Referring to FIGS. 1 and 2, according to an embodiment of the present inventive concept, the display device 10 includes a display area DA in which an image is displayed, and a peripheral area PA outside the display area DA. It may be understood that a substrate 100 included in the display device 10 includes the display area DA and the peripheral area PA.

In the display area DA, a plurality of (sub-)pixels P are arranged. FIG. 2 illustrates an example of the equivalent circuit diagram of a (sub-)pixel P. Referring to FIG. 2, the (sub-)pixel P may include a pixel circuit PC connected to a scan line SL and a data line DL, and a light-emitting diode connected to the pixel circuit PC. The light-emitting diode may be an organic light-emitting diode OLED, as an example.

The pixel circuit PC may include a driving thin-film transistor Td, a switching thin-film transistor Ts, and a storage capacitor Cst. The switching thin-film transistor Ts is connected to the scan line SL and the data line DL, and when a data signal is input via the data line DL, the switching thin-film transistor Ts may transmit the data signal to the driving thin-film transistor Td according to a scan signal input via the scan line SL. The storage capacitor Cst is connected to the switching thin-film transistor Ts and a driving voltage line PL. The storage capacitor Cst may store a voltage corresponding to a difference between a voltage transmitted from the switching thin-film transistor Ts and a driving voltage ELVDD supplied to the driving voltage line PL.

The driving thin-film transistor Td is connected to the driving voltage line PL and the storage capacitor Cst. In correspondence with a value of the voltage stored in the storage capacitor Cst, the driving thin-film transistor Td may control driving current flowing from the driving voltage line PL through the organic light-emitting diode OLED. The organic light-emitting diode OLED may emit light having a certain brightness according to the driving current. The organic light-emitting diode OLED may emit, for example, red, green, blue, or white light.

With reference to FIG. 2, a case when a (sub-)pixel P includes two thin-film transistors and a storage capacitor is described. However, the present disclosure is not limited thereto. As another example embodiment, various modifications may be made, such the pixel circuit PC of the (sub-)pixel P including three or more thin-film transistors and two or more storage capacitors.

Referring back to FIG. 1, the peripheral area PA of the substrate 100 may surround the display area DA. The peripheral area PA is an area in which the plurality of (sub-)pixels P are not arranged. The peripheral area PA includes a pad area PADA that is an area to which various electronic devices, a printed circuit board, or the like are electrically attached. A first voltage line 210 and a second voltage line 220, each supplying power for driving a light-emitting diode, may be arranged in the peripheral area PA. The first voltage line 210 may be a line for the driving voltage ELVDD, and the second voltage line 220 may be a line for a common voltage ELVSS. As an example, the first voltage line 210 may be arranged between an edge of the display area DA and the pad area PADA, and the second voltage line 220 may be arranged in correspondence with another edge of the display area DA. As an example, the second voltage line 220 may surround other edges of the display area DA than the edge of the display area DA at which the first voltage line 210 is arranged.

FIG. 1 may be understood as a plan view of the substrate 100 and other elements. when the display device 10 is being manufactured. In an electronic device such as the display device 10 that is a final product, a smartphone including the display device 10, a part of the substrate 100 and other elements. may be bent to minimize the size of the peripheral area PA seen by a user.

Figure 3:
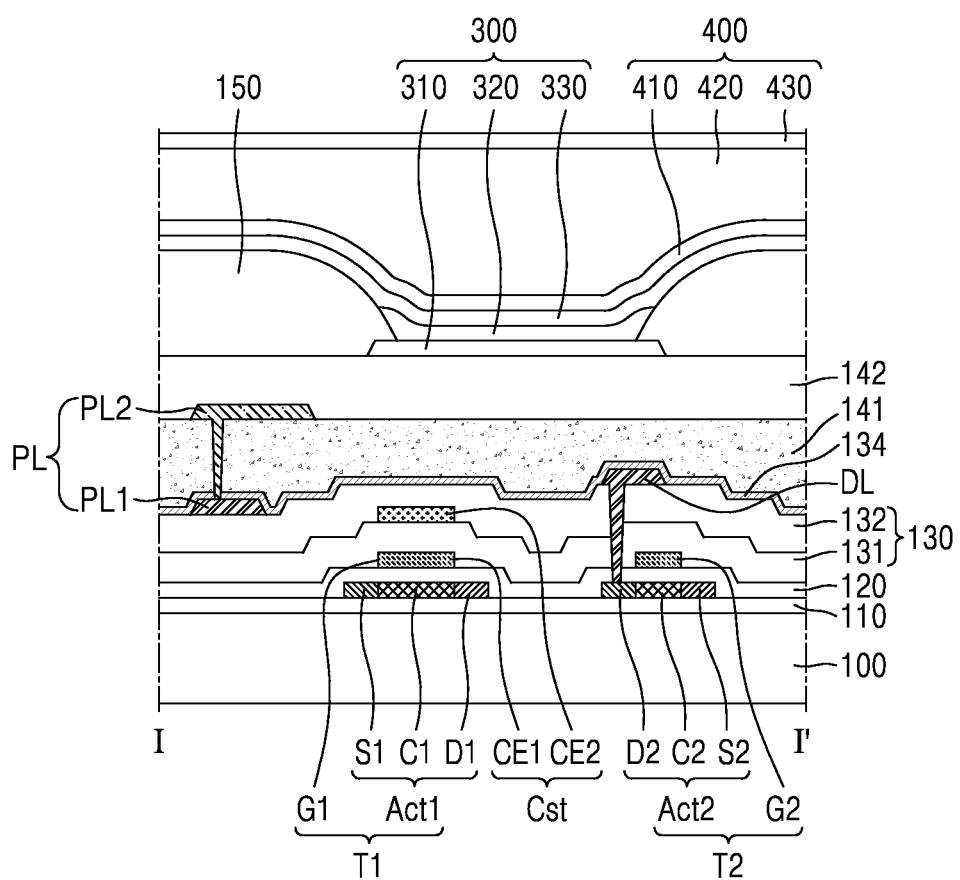
FIG. 3 is a schematic cross-sectional view illustrating an example of a cross-section taken along a line I-I' of FIG. 1.
Figure 4:
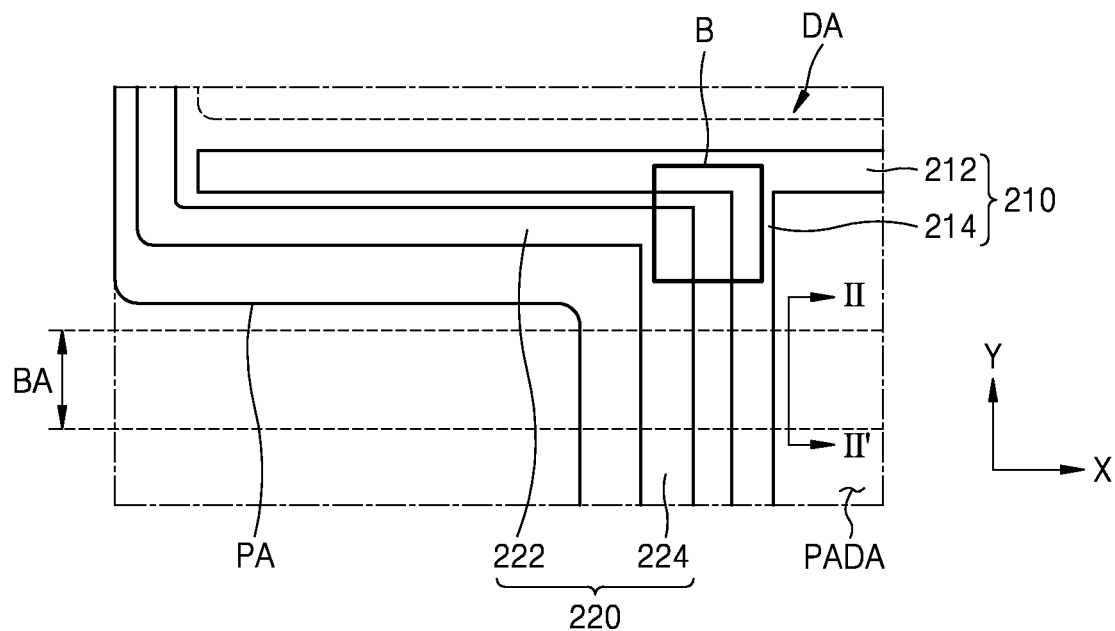
FIG. 4 is a schematic plan view of an area A of FIG. 1.
Figure 5:
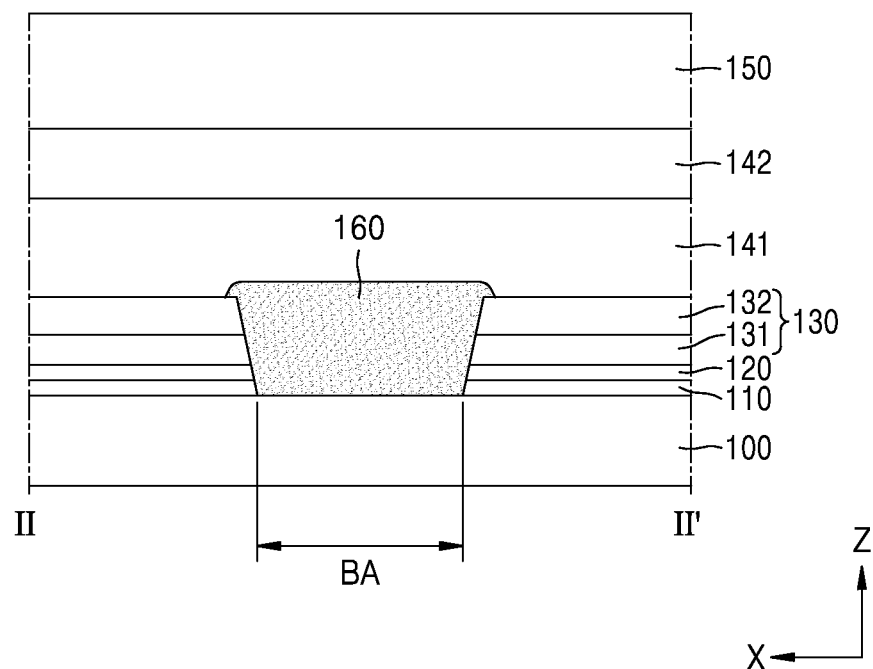
FIG. 5 is a schematic cross-sectional view illustrating an example of a cross-section taken along a line II-II' of FIG. 4.

FIG. 3 is a schematic cross-sectional view illustrating an example of a cross-section taken along a line I-I' of FIG. 1. FIG. 4 is a schematic plan view of an area A of FIG. 1. FIG. 5 is a schematic cross-sectional view illustrating an example of a cross-section taken along a line II-II' of FIG. 4.

As described above, a part of the substrate 100 may be bent to minimize the size of the peripheral area PA. For example, as shown in FIG. 4, the peripheral area PA may include a bending area BA, and the bending area BA may be arranged between the pad area PADA and the display area DA. In this case, by bending the substrate 100 in the bending area BA, at least a part of the pad area PADA may be arranged to overlap the display area DA. A bending direction is set such that the pad area PADA does not cover the display area DA but is arranged behind the display area DA. Accordingly, a user may recognize that the display area DA takes up most of the display device 10.

The substrate 100 may include various flexible or bendable materials. For example, the substrate 100 may include a polymer resin such as polyethersulphone (PES), polyacrylate, polyetherimide (PEI), polyethylene naphthalate (PEN), polyethylene terephthalate (PET), polyphenylene sulfide (PPS), polyarylate (PAR), polyimide (PI), polycarbonate (PC), cellulose acetate propionate (CAP), or the like. However, the substrate 100 may be variously modified, for example, to have a multi-layered structure including two layers including such polymer resins and a barrier layer arranged therebetween, wherein the barrier layer includes an inorganic material (such as silicon oxide (SiOx), silicon nitride (SiNx), or silicon oxynitride (SiON)).

Hereinafter, referring to FIG. 3, a structure of a (sub-)pixel is described in detail.

As shown in FIG. 3, in the display area DA, a first thin-film transistor T1, a second thin-film transistor T2, the storage capacitor Cst, and a light-emitting diode 300 may be arranged. The light-emitting diode 300 may include, as an example, the organic light-emitting diode OLED. The first thin-film transistor T1 may include the driving thin-film transistor Td (shown in FIG. 2) of the pixel circuit PC (shown in FIG. 2) described with reference to FIG. 2. In addition, the second thin-film transistor T2 and the storage capacitor Cst may correspond to the switching thin-film transistor Ts (shown in FIG. 2) and the storage capacitor Cst (shown in FIG. 2) of the pixel circuit PC (shown in FIG. 2), respectively, described with reference to FIG. 2.

The first thin-film transistor T1 may include a first semiconductor layer Act1 and a first gate electrode G1. The second thin-film transistor T2 may include a second semiconductor layer Act2 and a second gate electrode G2.

The first semiconductor layer Act1 and the second semiconductor layer Act2 may each include amorphous silicon, polycrystalline silicon, an oxide semiconductor material or an organic semiconductor material. The first semiconductor layer Act1 may include a channel area C1, and a source area S1 and a drain area D1 arranged at both sides of the channel area C1, respectively. The second semiconductor layer Act2 may include a channel area C2, and a source area S2 and a drain area D2 arranged at both sides of the channel area C2, respectively. The source area S1 and the drain area D1 of the first semiconductor layer Act1 may be understood as a source electrode and a drain electrode of the first semiconductor layer Act1, respectively. The source area S2 and the drain area D2 of the second semiconductor layer Act2 may be understood as a source electrode and a drain electrode of the second semiconductor layer Act2, respectively.

The first gate electrode G1 may overlap the channel area C1 of the first semiconductor layer Act1 with the gate insulating layer 120 therebetween. The second gate electrode G2 may overlap the channel area C2 of the second semiconductor layer Act2 with the gate insulating layer 120 therebetween. The first gate electrode G1 and the second gate electrode G2 may each include a single layer or layers including a conductive material including at least one selected from molybdenum (Mo), aluminum (Al), copper (Cu), and titanium (Ti).

FIG. 3 shows that the first gate electrode G1 and the second electrode G2 are arranged on a same layer. However, the present disclosure is not limited thereto. As another embodiment, the first gate electrode G1 and the second gate electrode G2 may be arranged on different layers. In addition, FIG. 3 illustrates an example in which the first gate electrode G1 and the second gate electrode G2 are arranged over the first semiconductor layer Act1 and the second semiconductor layer Act2, respectively. However, the present disclosure is not limited thereto. As another embodiment, the first thin-film transistor T1 and the second thin-film transistor T2 may be bottom-gate type transistors in which the first semiconductor layer Act1 and the second semiconductor layer Act2 are arranged over the first gate electrode G1 and the second gate electrode G2, respectively.

The storage capacitor Cst may include a first storage capacitive plate CE1 and a second storage capacitive plate CE2. The first storage capacitive plate CE1 and the second storage capacitive plate CE2 may each include a low-resistance conductive material including at least one selected from Mo, Al, Cu, and Ti.

The storage capacitor Cst may be arranged to overlap the first thin-film transistor T1 that is a driving thin-film transistor. Thus, sizes of the storage capacitor Cst and the driving thin-film transistor T1 may be increased and a high-quality image may be provided. As an example, the first storage capacitive plate CE1 may be the first gate electrode G1 of the thin-film transistor T1. However, the present disclosure is not limited thereto. As another embodiment, the storage capacitor Cst may be arranged not to overlap the first thin-film transistor T1, and the first storage capacitive plate CE1 may be a separate element from the first gate electrode G1 of the first thin-film transistor T1.

Between the substrate 100 and the first and second thin-film transistors T1 and T2, a buffer layer 110 may be arranged. The buffer layer 110 may include an inorganic insulating material. For example, the buffer layer 110 may include a single layer or layers including at least one selected from SiON, SiOx, and SiNx.

Between the first and second gate electrodes G1 and G2 and the first and second semiconductor layers Act1 and Act2, the gate insulating layer 120 may be arranged. The gate insulating layer 120 may include an inorganic insulating material. For example, the gate insulating layer 120 may include a single layer or layers including at least one selected from SiON, SiOx, and SiNx.

The first and second thin-film transistors T1 and T2 may be covered by an interlayer insulating layer 130. The interlayer insulating layer 130 may include a first interlayer insulating layer 131 and a second interlayer insulating layer 132. The first interlayer insulating layer 131 may be arranged directly on and in direct contact with the first and second thin-film transistors T1 and T2 and/or the first storage capacitive plate CE1. The second interlayer insulating layer 132 may be arranged directly on and in direct contact with the second storage capacitive plate CE2. Each of the first and second interlayer insulating layers 131 and 132 may include a single layer or multiple layers including at least one selected from SiON, SiOx, and SiNx. In one embodiment, the first interlayer insulating layer 131 may be a single layer including SiNx, and the second interlayer insulating layer 132 may include multiple layers including SiNx and SiOx.

On the interlayer insulating layer 130, the data line DL may be arranged. The data line DL may be connected to the second semiconductor layer Act2 of the second thin-film transistor T2 via a contact hole in the interlayer insulating layer 130. As an example, FIG. 3 illustrates that the data line DL is connected to the drain area D2 of the second thin-film transistor T2. In this case, the data line DL may be understood as a drain electrode. The data line DL may include a single layer or layers including one selected from Al, Cu, Ti, and an alloy thereof. In one embodiment, the data line DL may include three layers including Ti/Al/Ti, respectively.

On the interlayer insulating layer 130, a lower driving voltage line PL1 of the driving voltage line PL may be arranged. The lower driving voltage line PL1 may include a same material as that of the data line DL. In addition, over the interlayer insulating layers 130, various conductive layers in the display area DA and/or the peripheral area PA may be arranged. As such, the conductive layers over the interlayer insulating layer 130 may be collectively referred to as a 'first metal wiring'.

The first metal wiring includes at least the data line DL, the lower driving voltage line PL1 and may be covered by an inorganic protective layer 134. The inorganic protective layer 134 may include a single layer or layers including SiNx or SiOx. The inorganic protective layer 134 may prevent the first metal wiring from being damaged in an etching process, etc. performed in a process of manufacturing the display device 10 (shown in FIG. 1).

A first insulating layer 141 may be arranged on the first metal wiring, and an upper driving voltage line PL2 of the driving voltage line PL may be arranged on the first insulating layer 141. The upper driving voltage line PL2 may be arranged to overlap the lower driving voltage line PL1 and connected to the lower driving voltage line PL1 via a contact hole in the first insulating layer 141. The upper driving voltage line PL2 may include Mo, Al, Cu, Ti, or the like and include a single layer or layers. In some embodiments the upper driving voltage line PL2 may include a multi-layered structure including Ti/Al/Ti.

As such, when the driving voltage line PL includes the lower driving voltage line PL1 and the upper driving voltage line PL2, a resistance of the driving voltage line PL decreases. Thus, even when the display device 10 (shown in FIG. 1) is large, a voltage drop phenomenon caused by a resistance of the driving voltage line PL is reduced to thereby provide a high-quality image.

Over the first insulating layer 141, various conductive layers in addition to the upper driving voltage line PL2 may be arranged. As such, the conductive layers over the first insulating layer 141 may be collectively referred to as a 'second metal wiring'.

The upper driving voltage line PL2 may be covered by a second insulating layer 142 that is a planarized insulating layer. The first insulating layer 141 and the second insulating layer 142, each described above, may include an organic material. The organic material may include an imide-based polymer, a general-purpose polymer such as polymethyl methacrylate (PMMA) or polystyrene (PS), a polymer derivative containing a phenol group, an acrylic-based polymer, an aryl ether-based polymer, an amide-based polymer, a fluorine-based polymer, a p-xylene-based polymer, a vinyl alcohol-based polymer, or a blend thereof.

On the second insulating layer 142, the light-emitting diode 300 may be arranged wherein the light-emitting diode 300 includes a pixel electrode 310, a common electrode 330, and an intermediate layer 320 arranged between the pixel electrode 310 and the common electrode 330 and including a light-emitting layer. The light-emitting diode 300 may include, as an example, the organic light-emitting diode OLED.

The pixel electrode 310 is arranged on the second insulating layer 142. Although not illustrated in the drawing, the pixel electrode 310 may be electrically connected to the first thin-film transistor T1 therebelow via a contact hole in the second insulating layer 142.

On the second insulating layer 142, a pixel-defining layer 150 covering an edge of the pixel electrode 310 may be arranged. The pixel-defining layer 150 includes an opening corresponding to each pixel, that is, an opening exposing at least a central portion of the pixel electrode 310 to thereby define a pixel. In addition, the pixel-defining layer 150 may prevent generation of an arc and other issues between an edge of the pixel electrode 310 and the common electrode 330 by increasing a distance between the edge of the pixel electrode 310 and the common electrode 330. The pixel-defining layer 150 may be formed of an organic material such as polyimide, hexamethyldisiloxane (HMDSO), or the like.

On the pixel electrode 310 exposed through the opening in the pixel-defining layer 150, the intermediate layer 320 may be arranged. The intermediate layer 320 may include a low-molecular weight material or a polymer material. When the intermediate layer 320 includes a low-molecular weight material, the intermediate layer 320 may have a single-layered structure or a composite stack structure including a hole injection layer (HIL), a hole transport layer (HTL), an emission layer (EML), an electron transport layer (ETL), or an electron injection layer (EIL), and include various organic materials such as copper phthalocyanine (CuPc), N,N'-Di(naphthalene-1-yl)-N,N'-diphenyl-benzidine (NPB), tris-8-hydroxyquinoline aluminum (Alq3), etc. Such layers may be formed by using a vacuum deposition method.

When the intermediate layer 320 includes a polymer material, the intermediate layer 320 may generally have a structure including an HTL or an EML. The HTL may include a poly-(2,4)-ethylene-dihydroxy thiophene (PE-DOT). The EML may include a polymer material such as poly-phenylenevinylene (PPV), polyfluorene, etc. However, a structure of the intermediate layer 320 is not limited thereto, and may have various structures. For example, the intermediate layer 320 may include a layer arranged integrally over a plurality of pixel electrodes 310 or a layer patterned in correspondence with the plurality of pixel electrodes 310.

The common electrode 330 may be arranged to cover the display area DA. That is, the common electrode 330 may be formed as one continuous body to cover a plurality of light-emitting diodes 300.

On the common electrode 330, an encapsulation layer 400 is arranged. The encapsulation layer 400 protects the light-emitting diode 300 from external moisture, oxygen, etc. To do so, the encapsulation layer 400 has a shape extending through not only the display area DA in which the light-emitting diode 300 is arranged but also to the peripheral area PA outside the display area DA. The encapsulation layer 400 may have a multi-layered structure as shown in FIG. 3. In detail, the encapsulation layer 400 may include a first inorganic encapsulation layer 410, an organic encapsulation layer 420, and a second inorganic encapsulation layer 430 that are sequentially stacked.

The first inorganic encapsulation layer 410 is arranged on the common electrode 330, and may include SiOx, SiNx, and/or SiON. The first inorganic encapsulation layer 410 may be formed along a structure below the first inorganic encapsulation layer 410.

The organic encapsulation layer 420 is arranged on the first inorganic encapsulation layer 410 and has such a sufficient thickness that an upper surface of the organic encapsulation layer 420 is substantially flat. The organic encapsulation layer 420 may include one or more materials selected from the group consisting of polyethylene terephthalate, polyacrylate, polyethylene naphthalate, polycarbonate, polyimide, polyethylene sulfonate, polyoxymethylene, polyarylate, and HMDSO.

The second inorganic encapsulation layer 430 may cover the organic encapsulation layer 420 and include SiOx, SiNx, and/or SiON. The first inorganic encapsulation layer 410 and the second inorganic encapsulation layer 430 each may be larger than the organic encapsulation layer 420. The first inorganic encapsulation layer 410 may contact the second inorganic encapsulation layer 430 outside the organic encapsulation layer 420. That is, the first inorganic encapsulation layer 410 and the second inorganic encapsulation layer 430 may prevent the organic encapsulation layer 420 from being exposed to the outside.

As such, since the encapsulation layer 400 includes the first inorganic encapsulation layer 410, the organic encapsulation layer 420, and the second inorganic encapsulation layer 430, even when cracks occur in the encapsulation layer 400 due to such a multi-layered structure, the cracks may not be connected to each other between the first inorganic encapsulation layer 410 and the organic encapsulation layer 420 or between the organic encapsulation layer 420 and the second inorganic encapsulation layer 430. Thus, the forming of a path via which external moisture, oxygen, etc. penetrates into the display area DA may be prevented or minimized.

As shown in FIG. 4, in the peripheral area PA, the first voltage line 210 and the second voltage line 220 may be arranged and the bending area BA may be set wherein the first voltage line 210 and the second voltage line 220 supply driving power to the light-emitting diode 300.

As an example, the first voltage line 210 may be a line for a first power voltage that is the driving voltage ELVDD and the second voltage line 220 may be a line for a second power voltage that is the common voltage ELVSS. The first voltage line 210 may be connected to the driving voltage line PL. The second voltage line 220 may be connected to the common electrode 330 directly or via another line.

The first voltage line 210 may be arranged between an edge of the display area DA and the pad area PADA. The first voltage line 210 may include a first connector 214 and a first main voltage line 212 arranged to correspond to the edge of the display area DA. For example, when the display area DA has a rectangular shape, the first main voltage line 212 may be arranged to correspond to a side of the display area DA. The first main voltage line 212 may be in parallel with and longer than a side of the display area DA. The side of the display area DA corresponding to the first main voltage line 212 may be adjacent to the pad area PADA.

The first connector 214 may protrude from the first main voltage line 212 and extend in a first direction Y. Here, the first direction is a direction Y from the display area DA to the pad area PADA. The first connector 214 may be connected to a pad (not shown).

The second voltage line 220 may surround and be directly adjacent to remaining edges of the display area DA other than an edge of the display area DA adjacent to the first voltage line 210. The second voltage line 220 may include a second main voltage line 222 corresponding to two opposite distal ends of the first main voltage line 212 and the remaining edges of the display area DA, and a second connector 224 protruding from an end of the second main voltage line 222 in the first direction Y and extending in the first direction Y. The first connector 214 may be connected to the pad (not shown).

The bending area BA is arranged between the display area PA and the pad area PADA. As shown in FIG. 5, the bending area BA is an area of the substrate 100 from which parts of the buffer layer 110, the gate insulating layer 120, the first interlayer insulating layer 131, and the second interlayer insulating layer 132 are removed. Hereinafter, the buffer layer 110, the gate insulating layer 120, and the interlayer insulating layer 130 are collectively referred to as an 'inorganic insulating layer'. That is, it may be understood that the inorganic insulating layer stacked on the substrate 100 includes a groove in a position corresponding to the bending area BA. By removing a part of the inorganic insulating layer, bending of the substrate 100 may be easily performed in the bending area BA, and when the bending of the substrate 100 is performed, occurrence of cracks, etc. in the inorganic insulating layer may be prevented.

The area from which the part of the inorganic insulating layer is removed may be filled with an organic material layer 160. With reference to the bending area BA, the organic material layer 160 may extend to a non-bending area adjacent to the bending area BA. The organic material layer 160 may not only compensate for a height difference in the bending area BA in which the inorganic insulating layer is removed, but also absorb stress that occurs due to the bending. Accordingly, when the bending is performed, the concentration of stress on various connection wires may be effectively and greatly reduced, wherein the various connection wires are arranged in the bending area BA to transmit an electrical signal from the pad (not shown) in the pad area PADA to the display area DA.

The organic material layer 160 may include at least one material selected from acrylic, methacryl, polyester, polyethylene, polypropylene, polyethylene terephthalate, polyethylene naphthalate, polycarbonate, polyimide, polyethylene sulfonate, polyoxymethylene, polyarylate, and HMDSO.

In the bending area BA, the first insulating layer 141, the second insulating layer 142, and the pixel-defining layer 150 are arranged. In addition, in the bending area BA, a bending protection layer may be further arranged over the pixel-defining layer 150 and configured so that a stress neutral plane is arranged in a periphery of wiring in the bending area BA when the bending is performed.

Figure 6:
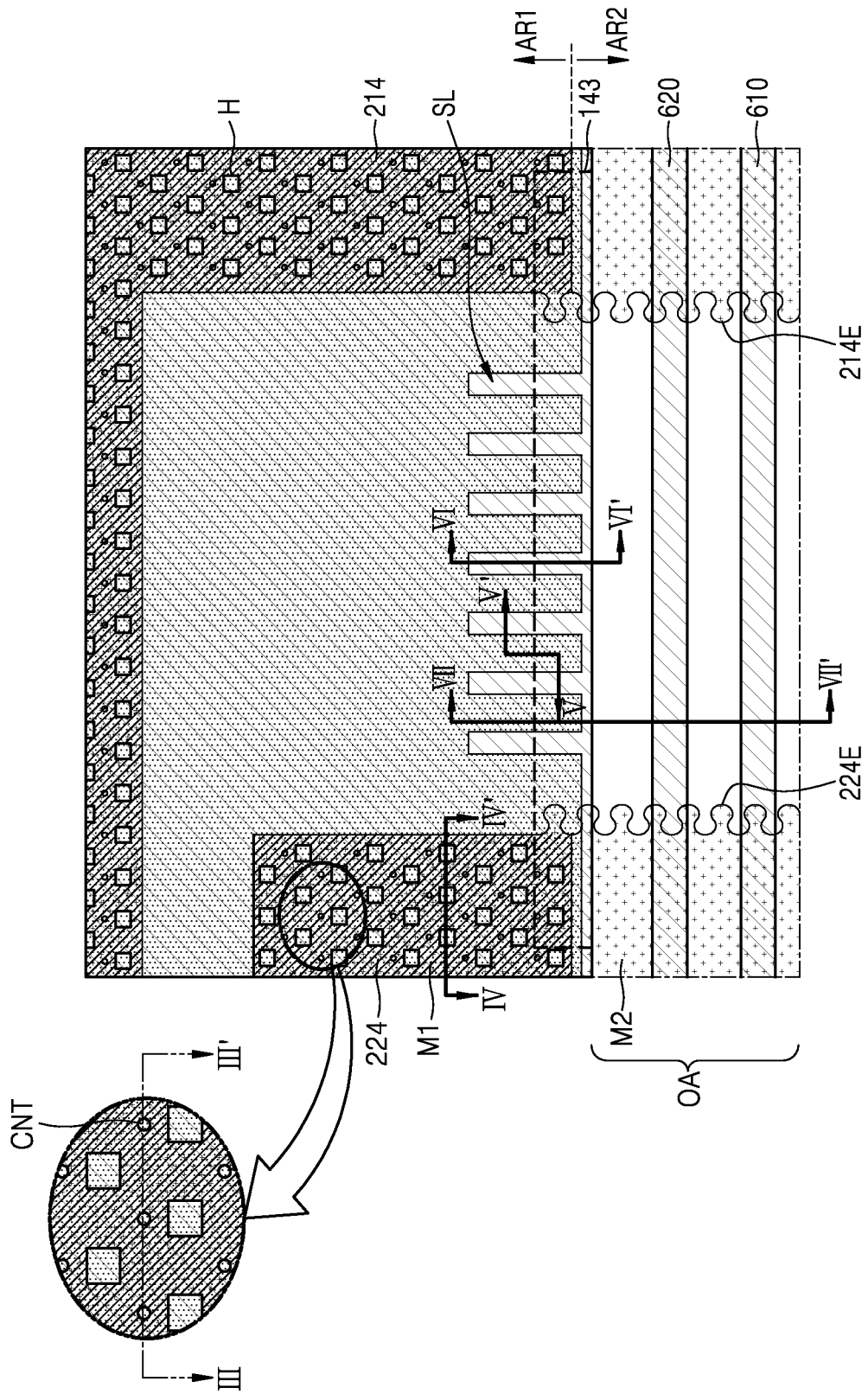
FIG. 6 is a schematic plan view of an area B of FIG. 4.

FIG. 6 is a schematic plan view of an area B of FIG. 4. FIGS. 7 to 11 are schematic cross-sectional views illustrating examples of cross-sections taken along lines III-III', IV-IV', V-V', VI-VI', and VII-VII' of FIG. 6, respectively.

Figure 7:
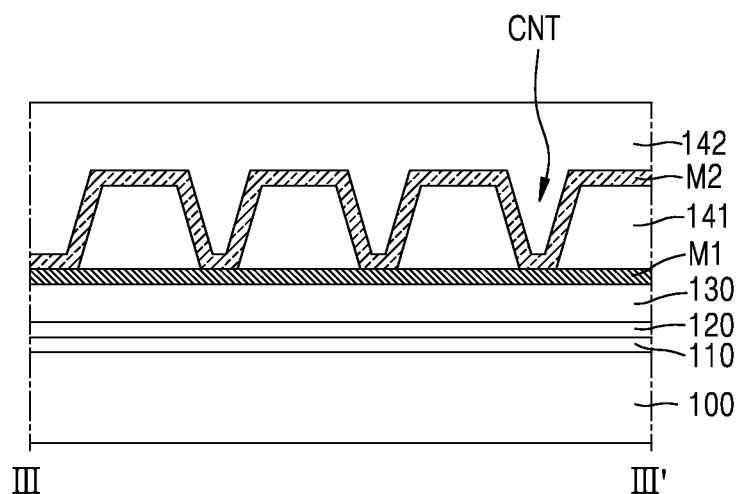
FIG. 7 is a schematic cross-sectional view illustrating an example of a cross-section taken along a line III-III' of FIG. 6.
Figure 8:
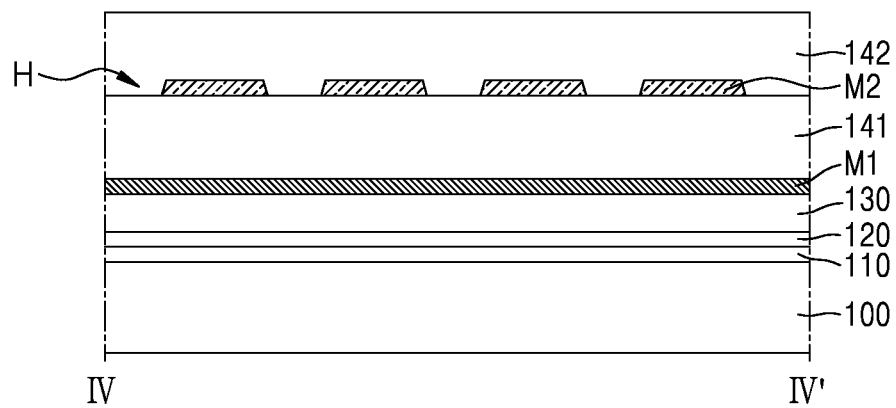
FIG. 8 is a schematic cross-sectional view illustrating an example of a cross-section taken along a line IV-IV' of FIG. 6.
Figure 9:
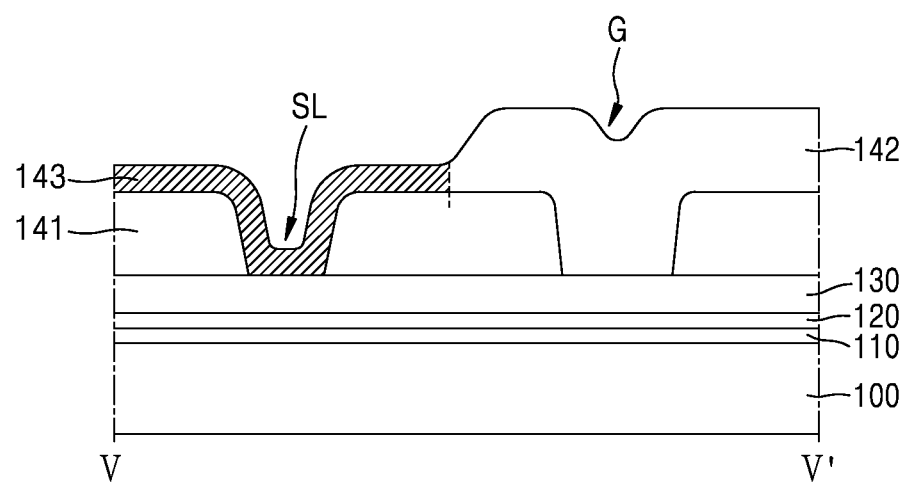
FIG. 9 is a schematic cross-sectional view illustrating an example of a cross-section taken along a line V-V' of FIG. 6.

First, with reference to FIGS. 6 to 8, a configuration of the second connector 224 is described. Referring to FIGS. 6 to 8, the second connector 224 may include a first layer M1 and a second layer M2 which overlap each other with the first insulating layer 141 therebetween.

The first layer M1 is a conductive layer on the interlayer insulating layer 130. The first layer M1 may be included in the first metal wiring. Accordingly, the first layer M1 may have a same structure as that of the data line DL (shown in FIG. 3). For example, the first layer M1 may include a single layer or layers including one selected from AL, Cu, Ti, and an alloy thereof. As an embodiment, the first layer M1 may include three layers including Ti/Al/Ti, respectively.

The second layer M2 is a conductive layer on the first insulating layer 141. The second layer M2 may be included in the second metal wiring. Accordingly, the second layer M2 may have a same structure as that of the upper driving voltage line PL2 (shown in FIG. 4). As shown in FIG. 7, the second layer M2 may be connected to the first layer M1 via a plurality of contact holes CNT in the first insulating layer 141.

In addition, as shown in FIG. 8, the second layer M2 may include a plurality of holes H. The plurality of holes H in the second layer M2 may emit gas from the inside of the first insulating layer 141. Accordingly, after the display device 10 (shown in FIG. 1) is manufactured, occurrence of a defect such as pixel shrinkage, etc. may be prevented, wherein the defect such as pixel shrinkage, etc. could otherwise be caused when the intermediate layer 320 (shown in FIG. 3) of the light-emitting diode 300 (in FIG. 3) deteriorates due to outgassing from the first insulating layer 141.

The plurality of holes H constitute a plurality of rows. In the plurality of rows, holes H in two rows adjacent to each other may be arranged to cross each other in a longitudinal direction. To connect the first layer M1 to the second layer M2, the plurality of contact holes CNT in the first insulating layer 141 may be arranged between the plurality of holes H. Accordingly, the plurality of contact holes CNT in the first insulating layer 141 also constitute a plurality of rows, and in the plurality of rows, contact holes CNT in two rows adjacent to each other may be arranged to cross each other in a longitudinal direction. Accordingly, compared to when the first insulating layer 141 is removed in a horizontal direction to connect the first layer M1 to the second layer M2, a height difference in the longitudinal direction is reduced. Thus, a probability in which cracks may occur in the second layer M2 may decrease, and a connection resistance between the first layer M1 and the second layer M2 may decrease.

Up to this point, the configuration of the second connector 224 has been described. However, the first connector 214, the first main voltage line 212 (shown in FIG. 4), and the second main voltage line 222 (shown in FIG. 4) may also have a same configuration as that of the second main voltage line 222. That is, because the first connector 214, the first main voltage line 212 (shown in FIG. 4), and the second main voltage line 222 (shown in FIG. 4) include the first layer M1 and the second layer M2 in a first area AR1, resistance may decrease, wherein the first layer M1 and the second layer M2 are connected to each other in parallel via the plurality of contact holes CNT in the first insulating layer 141. In this case, the second layer M2 may include the plurality of holes H.

Here, the first area AR1 refers to an area in which both the first layer M1 and the second layer M2 are arranged. On the other hand, a second area AR2 adjacent to the first area AR1 includes the bending area BA (shown in FIG. 4) and an area that may be affected by stress occurring when bending is performed in the bending area BA (shown in FIG. 4). To prevent damage that may be caused in the first connector 214 and the second connector 224 by stress, only the second layer M2 is arranged in the second area AR2, i.e., the first layer M1 is not arranged in the second area AR2.

Accordingly, even when the first connector 214 and the second connector 224 cross the bending area BA (shown in FIG. 4) and extend to the pad area PADA (shown in FIG. 4), since only the second layer M2 is arranged in the second area AR2, occurrence of damage to the first connector 214 and the second connector 224 due to stress may be prevented when the substrate 100 (shown in FIG. 1) is bent in the bending area BA (shown in FIG. 4).

As shown in FIG. 6, in the second area AR2, an open area OA in which the first insulating layer 141 and the second insulating layer 142 are removed may be arranged. In detail, an end of the first insulating layer 141 directing toward the open area OA may be covered by an end of the second insulating layer 142. Accordingly, the end of the second insulating layer 142 may be a boundary with the open area OA. The open area OA may expose the first connector 214 and the second connector 224. The open area OA may be arranged in the peripheral area PA (shown in FIG. 1) and may surround the display area DA (shown in FIG. 1). Accordingly, external moisture, etc. may be prevented from penetrating into the display area DA (shown in FIG. 1) via the first insulating layer 141 and/or the second insulating layer 142, both formed of an organic material.

The first voltage line 210 (shown in FIG. 4) and the second voltage line 220 (shown in FIG. 4) have structures in which the first layer M1 and the second layer M2 are stacked. Accordingly, compared to when the first voltage line 210 (shown in FIG. 4) and the second voltage line 220 (shown in FIG. 4) include either only the first layer M1 or the second layer M2, heights of the first voltage line 210 (shown in FIG. 4) and the second voltage line 220 (shown in FIG. 4) increase. Resultantly, a height difference between upper surfaces of the open area OA and the second insulating layer 142 increase. That is, as a depth of the open area OA increases, since a foreign material generated in a process of manufacturing the display device 10 (shown in FIG. 1) is precipitated from the open area OA or a residual layer is generated in an area in which a height difference between the open area OA and the second insulating layer 142 occurs, a short circuit between the first connector 214 and the second connector 224 may occur.

To prevent the occurrence of the short circuit, the first insulating layer 141 may include a plurality of slits SL extending from an end of the first insulating layer 141 toward the display area DA (shown in FIG. 1), wherein the end of the first insulating layer 141 is directed toward the open area OA. The plurality of slits SL are formed by removing the first insulating layer 141 in a direction perpendicular to a virtual line connecting the first connector 214 to the second connector 224. According to the plurality of slits SL, each of a plurality of concave portions G may be formed in portions of the second insulating layer 142 corresponding to each of the plurality of slits SL. Accordingly, for example, even when a particle is deposited between the first connector 214 and the second connector 224, wherein the particle is generated in a process of etching the second layer M2 or forming the pixel electrode 310 (shown in FIG. 3), forming of a continuous short-circuit path connecting the first connector 214 and the second connector 224 may be prevented.

Figure 10:
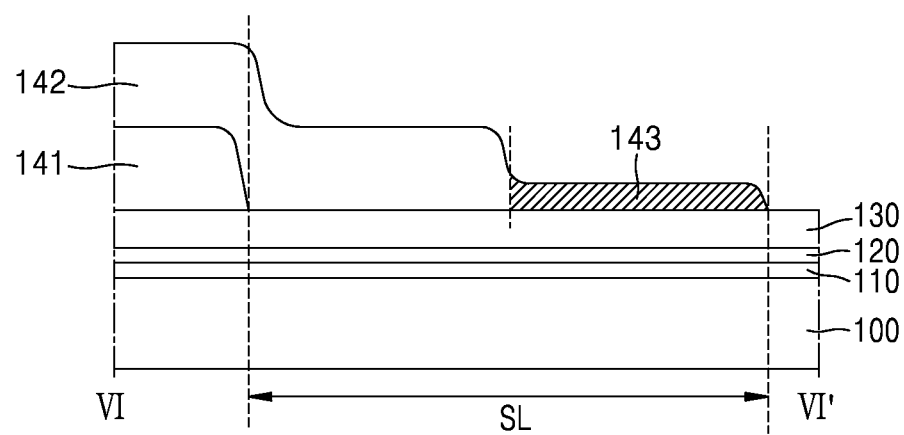
FIG. 10 is a schematic cross-sectional view illustrating an example of a cross-section taken along a line VI-VI' of FIG. 6.

In addition, the second insulating layer 142 may include a height difference reducer 143 at a boundary with the open area OA. The height difference reducer 143 has a thickness less than that of the second insulating layer 142. When the second insulating layer 142 is formed, the height difference reducer 143 may be formed together with the second insulating layer 142 by adjusting exposure dose using a halftone mask. As such, when the height difference reducer 143 is arranged in an area adjacent to the open area OA, a height difference between the second insulating layer 142 and the open area OA may be reduced, as shown in FIG. 10. Thus, generation of a residual layer in the area adjacent to the open area OA in a subsequent process may be effectively prevented. The height difference reducer 143 may be arranged at least between the first connector 124 and the second connector 224. Two opposite distal ends of the height difference reducer 143 may overlap the first connector 214 and the second connector 224, respectively.

Figure 11:
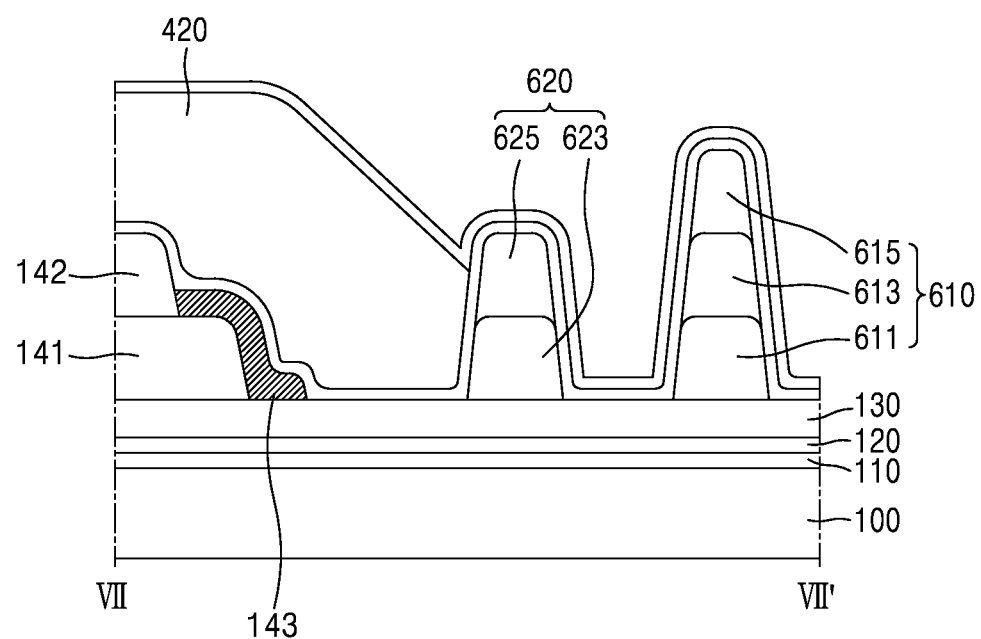
FIG. 11 is a schematic cross-sectional view illustrating an example of a cross-section taken along a line VII-VII' of FIG. 6.

In the open area OA, a first dam 610 may be arranged. When the organic encapsulation layer 420 is formed, the first dam 610 may limit a material of the organic encapsulation layer 420 to the inside of a preset area. The first dam 610 may have a multi-layered structure. As an example, as shown in FIG. 11, the first dam 610 may have a structure in which a first layer 611, a second layer 613, and a third layer 615 are stacked. The first layer 611 may be formed of a same material as that of the second insulating layer 152 and at same time as the second insulating layer 152. The second layer 613 may be formed of a same material as that of the pixel-defining layer 150 (shown in FIG. 3) and at same time as the pixel-defining layer 150. The third layer 615 may be formed of a same material as that of the second layer 613 and at same time as the second layer 613.

The first dam 610 supports masks used when the intermediate layer 320 (shown in FIG. 3) or the common electrode 330 (shown in FIG. 3) are formed in a manufacturing process. In this process, the first dam 610 may prevent previously-formed components from contacting the masks and being damaged by such contact. In addition, when the organic encapsulation layer 420 is formed on the first inorganic encapsulation layer 410, the first dam 610 may prevent the material of the organic encapsulation layer 420 from moving in a direction toward an edge of the substrate 100 (shown in FIG. 1).

As shown in FIG. 11, the first inorganic encapsulation layer 410 and the second inorganic encapsulation layer 430 may cover the first dam 610 and extend to the outside of the first dam 610 to thereby effectively prevent penetration of external moisture or oxygen.

Inside the first dam 610, i.e., between the first dam 610 and height difference reducer 143, a second dam 620 may be further arranged. The second dam 620 may include a lower layer 623 and an upper layer 625, wherein the lower layer 623 may be formed of a same material as that of the second layer 613 of the first dam 610 and at same time as the second layer 613, and the upper layer 625 is arranged on the lower layer 623 and may be formed a same material as that of the third layer 615 of the first dam 610 and at same time as the third layer 615. The second dam 620 may be shorter than the first dam 610.

The first dam 610 and the second dam 620 may obstruct the material of the organic encapsulation layer 420 from spreading to an edge of the substrate 100 by surrounding the display area DA (shown in FIG. 1). Thus, forming of an edge tail of the organic encapsulation layer 420 may be prevented.

As described above, a height difference may quickly change in the open area OA. Accordingly, when the material of the organic encapsulation layer 420 like a liquid organic material is applied to the open area OA, reflow of the material of the organic encapsulation layer 420 may mainly occur in the open area OA. In addition, recently, as the peripheral area PA (shown in FIG. 1) has been greatly reduced, a space between the first dam 610 and the second dam 620 is gradually decreased. Thus, it may be difficult to restrict flow of the material of the organic encapsulation layer 420. Particularly, the material of the organic encapsulation layer 420 spreads much more quickly in a direction along sides of the first connector 214 and the second connector 224 toward the pad area PADA (shown in FIG. 4) than a direction in which the first dam 610 and the second dam 620 are arranged. Accordingly, to prevent forming of an edge tail of the organic encapsulation layer 420, the material of the organic encapsulation layer 420 needs to be prevented from spreading in a direction toward the pad area PADA of FIG. 4.

To do so, as shown in FIG. 6, a side 224E of the first connector 214 and a side 214E of the second connector 224 may each include an embossed structure in the open area OA. For example, the side 224E of the first connector 214 and the side 214E of the second connector 224 may have a zipper shape. As such, when the side 224E of the first connector 214 and the side 214E of the second connector 224 are arranged, a dominant flow of the material of the organic encapsulation layer 420 may be obstructed at the side 224E of the first connector 214 and the side 214E of the second connector 224. Accordingly, when the material of the organic encapsulation layer 420 is applied, the material of the organic encapsulation layer 420 may be effectively prevented from spreading to an edge of the substrate 100 (shown in FIG. 1) over the first dam 610.

For convenience of description, FIGS. 7 to 10 do not illustrate the first inorganic encapsulation layer 410, the organic encapsulation layer 420, and the second inorganic encapsulation layer 430. However, the areas shown in FIGS. 7 to 10 are inner areas of the first dam 610 and the second dam 620. Accordingly, the embodiments illustrated by FIGS. 7 to 10 also includes the first inorganic encapsulation layer 410, the organic encapsulation layer 420, and the second inorganic encapsulation layer 430.

According to embodiments, since a first voltage line and a second voltage line each include a first layer and a second layer connected to each other in parallel, resistances in the first voltage line and the second voltage line decrease so that a display device may display a high-quality image. In addition, a short circuit between a first connector of the first voltage line and a second connector of the second voltage line may be effectively prevented, thus enhancing a reliability of the display device. However, the scope of the present disclosure is not limited to such an effect.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims.

What is claimed is:

1. A display device comprising:
a substrate comprising a display area, a peripheral area outside the display area, and a pad area in the peripheral area;
a first main voltage line arranged in the peripheral area of the substrate and between an edge of the display area and the pad area, and a first connector extending from the first main voltage line to the pad area; and
a second main voltage line arranged in the peripheral area of the substrate and corresponding to another edge of the display area, and a second connector extending from the second main voltage line to the pad area,
wherein each of the first connector and the second connector comprises a first layer and a second layer overlapping each other with a first insulating layer therebetween, wherein the first insulating layer is arranged in the display area and the peripheral area of the substrate,
the peripheral area comprises an open area exposing the first connector and the second connector and surrounding the display area, and
the first insulating layer comprises a plurality of slits arranged between the first connector and the second connector and extending from an end of the first insulating layer toward the display area.

2. The display device of claim 1, further comprising a second insulating layer on the second layer within the open area.

3. The display device of claim 2, wherein the second insulating layer further comprises a height difference reducer at a boundary with the open area between the first connector and the second connector, and
a thickness of the height difference reducer is less than a thickness of the second insulating layer.

4. The display device of claim 3, wherein two opposite distal ends of the height difference reducer overlap the first connector and the second connector, respectively.

5. The display device of claim 2, wherein the second insulating layer comprises a plurality of concave portions respectively overlapping with the plurality of slits.

6. The display device of claim 1, wherein, in the open area, the first connector and the second connector each comprise the second layer and do not comprise the first layer.

7. The display device of claim 6, wherein, in the open area, a side of the first connector and a side of the second connector comprise an embossed structure.

8. The display device of claim 1, wherein, in an area in which the second layer overlaps the first layer, the second layer comprises a plurality of holes exposing the first insulating layer.

9. The display device of claim 8, wherein the plurality of holes constitute a plurality of rows and holes in two rows adjacent to each other, among the plurality of rows, are arranged to cross each other in a longitudinal direction.

10. The display device of claim 9, wherein the first insulating layer comprises a plurality of contact holes via which the first layer is connected to the second layer and the plurality of contact holes are arranged between the plurality of holes, respectively.

11. A display device comprising:
a substrate comprising a display area, a peripheral area outside the display area, and a pad area in the peripheral area;
a first main voltage line arranged in the peripheral area of the substrate and between an edge of the display area and the pad area, and a first connector extending from the first main voltage line to the pad area; and
a second main voltage line arranged in the peripheral area of the substrate and corresponding to another edge of the display area, and a second connector extending from the second main voltage line to the pad area,
wherein each of the first connector and the second connector comprises a structure in which a first layer and a second layer are stacked,
a first insulating layer is arranged between the first layer and the second layer, and a second insulating layer is arranged on the second layer,
the peripheral area comprises an open area exposing parts of the first connector and the second connector and surrounding the display area, and the second insulating layer comprises a height difference reducer at a boundary of the open area between the first connector and the second connector, wherein the height difference reducer has a thickness less than a thickness of the second insulating layer.

12. The display device of claim 11, wherein two opposite distal ends of the height difference reducer overlap the first connector and the second connector, respectively.

13. The display device of claim 11, wherein, in the open area, the first connector and the second connector each comprise the second layer and do not comprise the first layer.

14. The display device of claim 13, wherein, in the open area, a side of the first connector and a side of the second connector comprise an embossed structure.

15. The display device of claim 13, wherein, in an area in which the second layer overlaps the first layer, the second layer comprises a plurality of holes exposing the first insulating layer.

16. The display device of claim 15, wherein the plurality of holes constitute a plurality of rows and holes in two rows adjacent to each other, among the plurality of rows, are arranged to cross each other in a longitudinal direction.

17. The display device of claim 15, wherein the first insulating layer comprises a plurality of contact holes via which the first layer is connected to the second layer and the plurality of contact holes are arranged between the plurality of holes, respectively.

18. The display device of claim 11, wherein the first insulating layer comprises a plurality of slits arranged between the first connector and the second connector and extending from an end of the first insulating layer toward the display area.

19. The display device of claim 18, wherein the second insulating layer comprises a plurality of concave portions respectively overlapping with the plurality of slits.

20. The display device of claim 11, wherein, in the open area, at least one dam is arranged and surrounds the display area.

* * * * *